US012622070B2

(12) United States Patent
Duchateau et al.

(10) Patent No.: US 12,622,070 B2
(45) Date of Patent: May 5, 2026

(54) ENCAPSULANT FILM BASED ON FUNCTIONALIZED POLYOLEFINS

(71) Applicant: SABIC GLOBAL TECHNOLOGIES B.V., Bergen op Zoom (NL)

(72) Inventors: Robbert Duchateau, Roostenlaan (NL); Lidia Jasinska-Walc, Veldhoven (NL); Miloud Bouyahyi, Eindhoven (NL); Jakub Kruszynski, Geleen (NL); Weronika Nowicka, Sittard (NL); Wojciech Szot, Czluchow (PL)

(73) Assignee: SABIC GLOBAL TECHNOLOGIES B.V., Bergen Op Zoom (NL)

( * ) Notice: Subject to any disclaimer, the term of this patent is extended or adjusted under 35 U.S.C. 154(b) by 0 days.

(21) Appl. No.: 18/874,474

(22) PCT Filed: Jun. 16, 2023

(86) PCT No.: PCT/EP2023/066299

§ 371 (c)(1),
(2) Date: Dec. 12, 2024

(87) PCT Pub. No.: WO2023/242420

PCT Pub. Date: Dec. 21, 2023

(65) Prior Publication Data

US 2025/0374687 A1 Dec. 4, 2025

(30) Foreign Application Priority Data

Jun. 16, 2022 (EP) .................................... 22179456

(51) Int. Cl.
*H10F 19/80* (2025.01)
*C08F 16/04* (2006.01)
*H10F 77/50* (2025.01)

(52) U.S. Cl.
CPC ............ *H10F 19/804* (2025.01); *C08F 16/04* (2013.01); *H10F 77/50* (2025.01)

(58) Field of Classification Search
CPC ......... H10F 19/804; H10F 77/50; C08F 16/04
See application file for complete search history.

(56) References Cited

U.S. PATENT DOCUMENTS

| | | | | |
|---|---|---|---|---|
| 2009/0120489 | A1 | 5/2009 | Nishijima et al. | |
| 2014/0000681 | A1 | 1/2014 | Zhao et al. | |
| 2014/0000682 | A1* | 1/2014 | Zhao | H10F 19/804 136/251 |
| 2016/0013342 | A1* | 1/2016 | Koide | H10F 77/122 136/259 |

FOREIGN PATENT DOCUMENTS

| | | | |
|---|---|---|---|
| WO | 2022106689 | A1 | 5/2022 |

OTHER PUBLICATIONS

International Search Report and Written Opinion of the ISA/EPO mailed Sep. 13, 2023 for PCT/EP2023/066299 filed Jun. 16, 2023, 8 pages.

* cited by examiner

*Primary Examiner* — Mayla Gonzalez Ramos
(74) *Attorney, Agent, or Firm* — CANTOR COLBURN LLP

(57) ABSTRACT

The invention relates to a film comprising a functionalized polyolefin polymer and to the use of the film as an encapsulant film for a photovoltaic module. The functionalized polyolefin polymer is a polymer selected from: (a) a propylene copolymer, (b) a propylene terpolymer, (c) an ethylene terpolymer, and (d) a polymer mixture comprising any combination of polymers (a) to (c). Further, the functionalized polyolefin polymer comprises <0.8 wt %, of an inorganic metal oxide such as alumina, based on the total weight of the functionalized polyolefin polymer. The invention further relates to an encapsulated solar cell comprising encapsulant layers comprising the film. The invention further relates to a photovoltaic module comprising the encapsulated solar cell and to a process for making the photovoltaic module.

16 Claims, No Drawings

ENCAPSULANT FILM BASED ON FUNCTIONALIZED POLYOLEFINS

CROSS REFERENCE TO RELATED APPLICATIONS

This application is a National Stage application of PCT/EP2023/066299, filed Jun. 16, 2023, which claims the benefit of European Application No. 22179456.3, filed Jun. 16, 2022, both of which are incorporated by reference in their entirety herein.

FIELD OF INVENTION

The invention relates to a film comprising a polar group functionalized polyolefin polymer and to the use of the film as an encapsulant film for a photovoltaic module. The invention further relates to an encapsulated solar cell comprising one or more encapsulant layers comprising the film. The invention further relates to a photovoltaic module comprising the encapsulated solar cell and to a process for making the making such a photovoltaic module.

BACKGROUND

Polymeric materials such as ethylene-vinyl acetate copolymers (EVA) and polyolefin elastomers (POE), are commonly used as encapsulants in photovoltaic modules. Some desirable properties and functions of such polymeric materials include (i) high electrical resistance (or volume resistivity) (ii) excellent moisture and gas barrier property, (iii) ease of processing, (iv) excellent optical transmittance, and (v) suitable mechanical properties such as tensile modulus.

Polymeric material such as ethylene-vinyl acetate copolymers (EVA) and polyolefins such as polyolefin elastomers (POE) have been used for preparing polymeric encapsulants suitable for photovoltaic modules and other allied applications. However, EVA copolymer, owing to its polarity, suffer from having low volume resistivity and low moisture barrier properties, as compared to a conventional polyolefin elastomers. Further, it has been observed that EVA based films progressively darken on prolonged exposure to sunlight due to chemical degradation, which adversely affects the utility of the film. In addition, EVA resins tend to degrade on account of prolonged exposure to atmospheric moisture induced through hydrolysis. Additionally, hydrolysis of EVA forms acetic acid as an undesired side product, which is harmful for the electronic components of a photovoltaic module.

To circumvent these shortcomings of EVA copolymers, polyolefin polymers have been investigated as a possible alternative. Despite the benefits that a polyolefin encapsulant film may offer, for example of having high volume resistivity, low gas and moisture permeability, polyolefins have their own set of shortcomings.

Therefore, it is an object of the present invention to provide a film, which can be used as an encapsulant film in a photovoltaic module having one or more of the following advantages of (i) desirably high electrical resistance (or volume resistivity), (ii) excellent adhesion property (iii) excellent moisture and gas barrier property, (iv) ease of processability, (v) excellent optical transmittance, (vi) recyclability and (vii) suitable mechanical properties such as tensile modulus.

DESCRIPTION

Accordingly, one or more objectives of the present invention is achieved by a film comprising a functionalized polyolefin polymer, wherein the functionalized polyolefin polymer is a polymer selected from the group consisting of:

a. a propylene copolymer, comprising
   i. ≥95.0 mol % and ≤99.95 mol %, preferably ≥98.0 mol % and ≤99.95 mol %, preferably ≥99.0 mol % and ≤99.9 mol %, preferably ≥99.5 mol % and ≤99.9 mol %, of polymeric units derived from propylene, and
   ii. ≥0.05 mol % and ≤5.0 mol %, preferably ≥0.05 mol % and ≤2.0 mol %, preferably ≥0.1 mol % and ≤1.0 mol %, preferably ≥0.1 mol % and ≤0.5 mol %, of polymeric units derived from a functionalized olefin monomer, based on the total moles of all polymeric units constituting the propylene copolymer, b. a propylene terpolymer, comprising
   i. ≥80.0 mol % and ≤98.95 mol %, preferably ≥88.0 mol % and ≤98.0 mol %, preferably ≥90.0 mol % and ≤96.0 mol %, of polymeric units derived from propylene;
   ii. ≥0.1 mol % and ≤19.95 mol %, preferably ≥1.0 mol % and ≤10.0 mol %, preferably ≥3.5 mol % and ≤9.9 mol %, of polymeric units derived from a first olefin monomer comprising either 2, or 4 to 8 carbon atoms, preferably the first olefin monomer comprises 2 or 6 carbon atoms; and
   iii. ≥0.05 mol % and ≤5.0 mol %, preferably ≥0.1 mol % and ≤2.0 mol %, preferably ≥0.1 mol % and ≤0.5 mol %, of polymeric units derived from a functionalized olefin monomer, based on the total moles of all polymeric units constituting the propylene terpolymer;

c. an ethylene terpolymer, comprising:
   i. ≥80.0 mol % and ≤98.95 mol %, preferably ≥90.0 mol % and ≤97.0 mol %, of polymeric units derived from ethylene,
   ii. ≥0.1 mol % and ≤19.95 mol %, preferably ≥2.5 mol % and ≤9.9 mol %, of polymeric units derived from a second olefin monomer comprising 3 to 8 carbon atoms, preferably the second olefin monomer comprises 8 carbon atoms; and
   iii. ≥0.05 mol % and ≤5.0 mol %, preferably ≥0.1 mol % and ≤0.5 mol %, of polymeric units derived from a functionalized olefin monomer;

based on the total moles of all polymeric units constituting the ethylene terpolymer; and d. a polymer mixture comprising any combination of polymers (a) to (c);

wherein the functionalized olefin monomer is a monomer selected from:
   i. a hydroxyl group containing olefin monomer having 4 to 12 carbon atoms, preferably 4 to 8 carbon atoms;
   ii. a carboxylic acid containing olefin monomer having 2 to 12 carbon atoms, preferably 4 to 8 carbon atoms; and
   iii. an esterified olefin monomer represented by the formula:

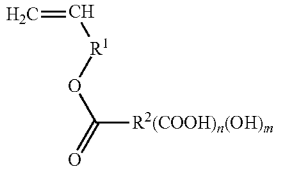

wherein $R^1$ is selected from a hydrocarbyl group having 2 to 10 carbon atoms, preferably 2 to 6 carbon atoms, more preferably 4 or 6 carbon atoms;

wherein $R^2$ is selected from a hydrocarbyl group having 2 to 10 carbon atoms, and wherein 'n' is an integer from 1 to 3 and 'm' is an integer from 0 to 4, preferably 1 to 4, wherein the functionalized polyolefin polymer comprises ≤0.8 wt %, preferably ≤0.5 wt %, preferably ≤0.2 wt %, of inorganic metal oxide, based on the total weight of the functionalized polyolefin polymer and determined using Inductively Coupled Plasma Mass Spectrometry, preferably the inorganic metal oxide comprises a metal selected from Group 13 (Group III) of the Periodic Table, preferably the inorganic metal oxide is alumina.

Preferably, present invention is achieved by a film comprising a functionalized polyolefin polymer, wherein the functionalized polyolefin polymer is a propylene terpolymer, comprising:

i. ≥80.0 mol % and ≤98.95 mol %, preferably ≥88.0 mol % and ≤98.0 mol %, preferably ≥90.0 mol % and ≤96.0 mol %, of polymeric units derived from propylene;

ii. ≥0.1 mol % and ≤19.95 mol %, preferably ≥1.0 mol % and ≤10.0 mol %, preferably ≥3.5 mol % and ≤9.9 mol %, of polymeric units derived from a first olefin monomer comprising either 2, or 4 to 8 carbon atoms, preferably the first olefin monomer comprises 2 or 6 carbon atoms; and iii. ≥0.05 mol % and ≤5.0 mol %, preferably ≥0.1 mol % and ≤2.0 mol %, preferably ≥0.1 mol % and ≤0.5 mol %, of polymeric units derived from a functionalized olefin monomer, based on the total moles of all polymeric units constituting the propylene terpolymer, wherein the functionalized olefin monomer is a monomer selected from:

a. a hydroxyl group containing olefin monomer having 4 to 12 carbon atoms, preferably 4 to 8 carbon atoms;

b. a carboxylic acid containing olefin monomer having 2 to 12 carbon atoms, preferably 4 to 8 carbon atoms; and c. an esterified olefin monomer represented by the formula:

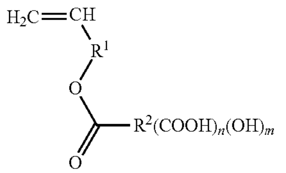

wherein $R^1$ is selected from a hydrocarbyl group having 2 to 10 carbon atoms, preferably 2 to 6 carbon atoms, more preferably 4 or 6 carbon atoms;

wherein $R^2$ is selected from a hydrocarbyl group having 2 to 10 carbon atoms, and wherein 'n' is an integer from 1 to 3 and 'm' is an integer from 0 to 4, wherein the functionalized polyolefin polymer comprises ≤0.8 wt %, preferably ≤0.5 wt %, preferably ≤0.2 wt %, of inorganic metal oxide, based on the total weight of the functionalized polyolefin polymer and determined using Inductively Coupled Plasma Mass Spectrometry, preferably the inorganic metal oxide comprises a metal selected from Group 13 (Group III) of the Periodic Table, preferably the inorganic metal oxide is alumina.

The term "hydrocarbyl" as used throughout this disclosure means a hydrocarbon group formed by removing one or more hydrogen atom from a hydrocarbon compound and such a group includes straight chain or branched hydrocarbons, saturated or unsaturated hydrocarbons, aliphatic and aromatic hydrocarbon groups. The term "terpolymer" as used throughout this disclosure means a polymer molecule having polymeric units derived from three different monomers. The term "copolymer" as used throughout this disclosure means a polymer molecule having polymeric units derived from three different monomers.

The symbol "≥" as used throughout this disclosure means any one of "greater than equal to" or "at least". For example, the term "≥95.0" means "greater than equal to 95.0" or "at least 95.0". The symbol "≤" as used throughout this disclosure means "less than equal to" or "not greater than". For example, the term "≤95.0" means "less than equal to 95.0" or "not greater than 95.0".

The film of the present invention may for example comprise the functionalized polyolefin polymer to be present in an amount of ≥95.0 wt % and ≤100.0 wt %, preferably ≥96.0 wt % and ≤100.0 wt %, preferably ≥97.0 wt % and ≤100.0 wt %, preferably ≥98.0 wt % and ≤100.0 wt %, preferably ≥99.95 wt % and ≤100.0 wt %, preferably 100.0 wt % based on the total weight of the film. In some embodiments of the invention, the film can comprise a combination of a functionalized polyolefin polymer and a polyolefin elastomer.

Accordingly, in some embodiments of the invention, the film of the present invention may for example comprise a combination of a polyolefin elastomer and the functionalized polyolefin polymer wherein the functionalized polyolefin polymer is present in an amount of ≥25.0 wt % and ≤95.0 wt %, preferably ≥30.0 wt % and ≤80.0 wt %, preferably ≥35.0 wt % and ≤75.0 wt %, preferably ≥40.0 wt % and ≤70.0 wt %, based on the total weight of the film.

Accordingly, in some embodiment of the invention, the film of the present invention may comprise a blend of the functionalized polyolefin polymer with a non-functionalized polyolefin polymer, preferably selected from the list comprising polyethylene, poly(ethylene-co-propylene), poly (ethylene-co-1-butene), poly(ethylene-co-1-hexene), poly (ethylene-co-1-octene), polypropylene, poly(propylene-co-ethylene), poly(propylene-co-1-butene), poly(propylene-co-1-hexene), poly(propylene-co-1-octene)

Advantageously, the film of the present invention demonstrates a suitable combination of one or more of (i) desirably high electrical resistance (or volume resistivity), (ii) excellent adhesion property (iii) excellent moisture and gas barrier property, (iv) ease of processability, (v) excellent optical transmittance, and (vi) suitable mechanical properties such as tensile modulus. The combination of one or more of such advantages properties, render the film of the present invention particularly suitable to be an encapsulant film. As a further advantage, the use the film of the present invention imparts excellent adhesion and mechanical properties without the requirement of being chemically cross-linked, thereby leading to reduced processing time and rendering such films to be easily recyclable as compared to conventional film using cross-linked polymers.

Accordingly, in some aspects the invention, the invention is directed to the use of the film in accordance with one or more embodiments of the present invention, as an encapsulant film for a photovoltaic module.

Functionalized Polyolefin Polymer

Propylene Copolymer

In some embodiments of the invention, the film may for example comprising a functionalized polyolefin polymer, wherein the functionalized polyolefin polymer may for example be a propylene copolymer. The propylene copolymer may for example comprise ≥95.0 mol % and ≤99.95 mol %, preferably ≥98.0 mol % and ≤99.95 mol %, preferably ≥99.0 mol % and ≤99.9 mol %, preferably ≥99.5 mol % and ≤99.9 mol %, of polymeric units derived from propylene and ≥0.05 mol % and ≤5.0 mol %, preferably ≥0.05 mol % and ≤2.0 mol %, preferably ≥0.1 mol % and ≤1.0 mol %, preferably ≥0.1 mol % and ≤0.5 mol %, of polymeric units derived from a functionalized olefin monomer, based on the total moles of all polymeric units constituting the propylene copolymer.

The propylene copolymer may for example comprise 96.0 mol %, 97.0 mol %, 98.0 mol %, 99.0 mol %, 99.5 mol %, 99.6 mol %, 99.7 mol %, 99.8 mol %, 99.9 mol % or 99.95 mol % of polymeric units derived from propylene, based on the total moles of all polymeric units constituting the propylene copolymer. The propylene copolymer may for example comprise 4.0 mol %, 3.0 mol %, 2.0 mol %, 1.0 mol %, 0.5 mol %, 0.4 mol %, 0.3 mol %, 0.2 mol %, 0.1 mol % or 0.05 mol %, of polymeric units derived from the functionalized olefin monomer, based on the total moles of all polymeric units constituting the propylene copolymer.

Preferably, in some embodiments of the invention, the propylene copolymer may comprise ≥98.0 mol % and ≤99.95 mol %, of polymeric units derived from propylene and ≥0.05 mol % and ≤2.0 mol %, of polymeric units derived from a functionalized olefin monomer, based on the total moles of all polymeric units constituting the propylene copolymer.

Preferably, in some embodiments of the invention, the propylene copolymer may comprise ≥99.0 mol % and ≤99.90 mol %, of polymeric units derived from propylene and ≥0.1 mol % and ≤1.0 mol %, of polymeric units derived from a functionalized olefin monomer, based on the total moles of all polymeric units constituting the propylene copolymer. Preferably, in some embodiments of the invention, the propylene copolymer may for comprise ≥99.5 mol % and ≤99.90 mol %, of polymeric units derived from propylene and ≥0.1 mol % and ≤0.5 mol %, of polymeric units derived from a functionalized olefin monomer, based on the total moles of all polymeric units constituting the propylene copolymer.

Propylene Terpolymer

In some embodiments of the invention, the film may for example comprise a functionalized polyolefin polymer, wherein the functionalized polyolefin polymer may for example be a propylene terpolymer. The propylene terpolymer may for example comprises (i) ≥80.0 mol % and ≤98.95 mol %, of polymeric units derived from propylene, (ii) ≥0.1 mol % and ≤19.95 mol % of polymeric units derived from the first olefin monomer comprising either 2, or 4 to 8 carbon atoms, preferably the first olefin monomer comprises 2 or 6 carbon atoms, and (iii) ≥0.05 mol % and ≤5.0 mol %, of polymeric units derived from a functionalized olefin monomer, based on the total moles of all polymeric units constituting the propylene terpolymer.

The polymeric units derived from propylene may for example be present in an amount of 85.0 mol %, 86.0 mol %, 88.0 mol %, 91.0 mol %, 91.2 mol %, 92.0 mol %, 94.0 mol %, 98.0 mol % or 98.95 mol %. The polymeric units derived from the first olefin monomer may for example be present in amount of 0.1 mol %, 1.0 mol %, 4.5 mol %, 6.0 mol %, 8.5 mol %, 11.0 mol %, 15.0 mol % or 19.5 mol %. The polymeric units derived from the functionalized olefin monomer may for example be present in an amount of 0.05 mol %, 0.1 mol %, 0.5 mol %, 1.0 mol %, 2.0 mol %, 3.0 mol %, 4.0 mol % or 5.0 mol %.

Preferably, the propylene terpolymer may comprise (i) ≥88.0 mol % and ≤98.0 mol %, of polymeric units derived from propylene, (ii) ≥1.0 mol % and ≤10.0 mol % of polymeric units derived from the first olefin monomer comprising either 2, or 4 to 8 carbon atoms, preferably the first olefin monomer comprises 2 or 6 carbon atoms, preferably the first olefin monomer comprises 6 carbon atoms, and (iii) ≥0.1 mol % and ≤2.0 mol %, of polymeric units derived from a functionalized olefin monomer, based on the total moles of all polymeric units constituting the propylene terpolymer.

More preferably, the propylene terpolymer may comprise (i) ≥90.0 mol % and ≤96.0 mol %, of polymeric units derived from propylene, (ii) ≥3.5 mol % and ≤9.9 mol % of polymeric units derived from the first olefin monomer comprising either 2, or 4 to 8 carbon atoms, preferably the first olefin monomer comprises 2 or 6 carbon atoms, preferably the first olefin monomer comprises 6 carbon atoms, and (iii) ≥0.1 mol % and ≤0.5 mol %, of polymeric units derived from a functionalized olefin monomer, based on the total moles of all polymeric units constituting the propylene terpolymer.

Ethylene Terpolymer

In some embodiments of the invention, the film may for example comprise a functionalized polyolefin polymer, wherein the functionalized polyolefin polymer may for example be an ethylene terpolymer. The ethylene terpolymer may for example comprise (i) ≥80.0 mol % and ≤98.95 mol %, of polymeric units derived from ethylene, (ii) ≥0.1 mol % and ≤19.95 mol % of polymeric units derived from a second olefin monomer comprising 3 to 8 carbon atoms, preferably the second olefin monomer comprises 8 carbon atoms, and (iii) ≥0.05 mol % and ≤5.0 mol %, of polymeric units derived from a functionalized olefin monomer, based on the total moles of all polymeric units constituting the ethylene terpolymer.

The polymeric units derived from ethylene may for example be present in an amount of 85.0 mol %, 86.0 mol %, 88.0 mol %, 91.0 mol %, 91.2 mol %, 92.0 mol %, 94.0 mol %, 98.0 mol % or 98.95 mol %. The polymeric units derived from the second olefin monomer may for example be present in amount of 0.1 mol %, 1.0 mol %, 4.5 mol %, 6.0 mol %, 8.5 mol %, 11.0 mol. %, 15.0 mol % or 19.5 mol %. The polymeric units derived from the functionalized olefin monomer may for example be present in an amount of 0.05 mol %, 0.1 mol %, 0.5 mol %, 1.0 mol %, 2.0 mol %, 3.0 mol %, 4.0 mol % or 5.0 mol %.

Preferably, the ethylene terpolymer may comprise (i) ≥90.0 mol % and ≤97.0 mol %, of polymeric units derived from ethylene, (ii) ≥2.5 mol % and ≤9.9 mol % of polymeric units derived from a second olefin monomer comprising 3 to 8 carbon atoms, preferably the second olefin monomer comprises 8 carbon atoms, and (iii) ≥0.1 mol % and ≤0.5 mol %, of polymeric units derived from a functionalized olefin monomer, based on the total moles of all polymeric units constituting the ethylene terpolymer.

Preferably, in some embodiments of the invention, the first olefin monomer comprising either 2 or 4 to 8 carbon atoms, is a monomer selected from ethylene, 1-butene, 1-hexene, 4-methyl-1-pentene, vinylcyclohexane, and 1-octene, preferably the first olefin monomer is selected from ethylene, or 1-hexene. Preferably, in some embodiments of the invention, the second olefin monomer comprising 3 to 8 carbon atoms is a monomer selected from propylene, 1-butene, 1-hexene, 4-methyl-1-pentene, vinylcyclohexane, and 1-octene, preferably the second olefin monomer is 1-octene.

Preferably, in some embodiments of the invention, (i) the first olefin monomer comprising either 2 or 4 to 8 carbon atoms, is a monomer selected from ethylene, 1-butene, 1-hexene, 4-methyl-1-pentene, vinylcyclohexane, and 1-octene, preferably the first olefin monomer is selected from ethylene, or 1-hexene; and/or (ii) the second olefin monomer comprising 3 to 8 carbon atoms is a monomer selected from propylene, 1-butene, 1-hexene, 4-methyl-1-pentene, vinylcyclohexane, and 1-octene, preferably the second olefin monomer is 1-octene.

Functionalized Olefin Monomer:

Hydroxyl Group Containing Olefin Monomer

In some embodiments of the invention, the functionalized olefin monomer is a hydroxyl group containing olefin monomer having 4 to 12 carbon atoms, preferably 4 to 8 carbon atoms. Preferably, the hydroxyl group containing olefin monomer is selected from 3-buten-1-ol, 5-hexen-1-ol, 7-octen-1-ol, and 10-undecen-1-ol, preferably the hydroxyl group containing olefin monomer is 5-hexen-1-ol.

Accordingly, in some embodiments of the invention, the propylene copolymer may for example comprise polymeric units derived from propylene and polymeric units derived from the hydroxyl group containing olefin monomer having 4 to 12 carbon atoms, preferably 4 to 8 carbon atoms. Preferably, the propylene copolymer comprises polymeric units derived from propylene and polymeric units derived from 5-hexen-1-ol.

The propylene terpolymer may for example comprise (i) polymeric units derived from propylene, (ii) polymeric units derived from the first olefin monomer comprising either 2, or 4 to 8 carbon atoms, preferably the first olefin monomer comprises 2 or 6 carbon atoms, preferably the first olefin monomer comprises 6 carbon atoms, and (iii) polymeric units derived from a hydroxyl group containing olefin monomer having 4 to 12 carbon atoms, preferably 4 to 8 carbon atoms.

Preferably, in some embodiments of the invention, the propylene terpolymer may comprise (i) polymeric units derived from propylene, (ii) polymeric units derived from the first olefin monomer comprising 6 carbon atoms, and (iii) polymeric units derived from 5-hexen-1-ol. Preferably, in some embodiments of the invention, the propylene terpolymer may comprise (i) polymeric units derived from propylene, (ii) polymeric units derived from 1-hexene, and (iii) polymeric units derived from 5-hexen-1-ol.

Preferably, in some embodiments of the invention, the propylene terpolymer may comprise (i) polymeric units derived from propylene, (ii) polymeric units derived from ethylene, and (iii) polymeric units derived from 5-hexen-1-ol.

The ethylene terpolymer may for example comprise (i) polymeric units derived from ethylene, (ii) polymeric units derived from the second olefin monomer comprising 3 to 8 carbon atoms, preferably the second olefin monomer comprises 8 carbon atoms, and (iii) polymeric units derived from a hydroxyl group containing olefin monomer having 4 to 12 carbon atoms, preferably 4 to 8 carbon atoms.

Carboxylic Acid Containing Olefin Monomer

In some embodiments of the invention, the functionalized olefin monomer is a carboxylic acid containing olefin monomer having 2 to 12 carbon atoms, preferably 4 to 8 carbon atoms. Preferably, in some embodiments of the invention, the carboxylic acid containing olefin monomer is selected from acrylic acid, 3-butenoic acid, 4-pentenoic acid, 5-hexenoic acid, 10-undecenoic acid, 5-norbornene-2-carboxylic acid and 5-norbornene-2-acetic acid, preferably the carboxylic acid containing olefin monomer is acrylic acid, 3-butenoic acid, 4-pentenoic acid and 5-norbornene-2-carboxylic acid.

Accordingly, the in some embodiments of the invention, the propylene copolymer may for example comprise (i) polymeric units derived from propylene and (ii) polymeric units derived from the carboxylic acid containing olefin monomer having 2 to 12 carbon atoms, preferably 4 to 8 carbon atoms.

In some embodiments of the invention, the propylene terpolymer may comprise (i) polymeric units derived from propylene, (ii) polymeric units derived from the first olefin monomer comprising either 2, or 4 to 8 carbon atoms, preferably the first olefin monomer comprises 2 or 6 carbon atoms, preferably the first olefin monomer comprises 6 carbon atoms, and (iii) polymeric units derived from the carboxylic acid containing olefin monomer having 2 to 12 carbon atoms, preferably 4 to 8 carbon atoms.

In some embodiments of the invention, the ethylene terpolymer may comprise (i) polymeric units derived from ethylene, (ii) polymeric units derived from the second olefin monomer comprising 3 to 8 carbon atoms, preferably the second olefin monomer comprises 8 carbon atoms, and (iii) polymeric units derived from the carboxylic acid containing olefin monomer having 2 to 12 carbon atoms, preferably 4 to 8 carbon atoms.

Preferably, in some embodiments of the invention, (i) the carboxylic acid containing olefin monomer is selected from acrylic acid, 3-butenoic acid, 4-pentenoic acid, 5-hexenoic acid, 10-undecenoic acid, 5-norbornene-2-carboxylic acid and 5-norbornene-2-acetic acid, preferably the carboxylic acid containing olefin monomer is acrylic acid, 3-butenoic acid, 4-pentenoic acid and 5-norbornene-2-carboxylic acid; and/or wherein (ii) the hydroxyl group containing olefin monomer is selected from 3-buten-1-ol, 5-hexen-1-ol, 7-octen-1-ol, and 10-undecen-1-ol, preferably the hydroxyl group containing olefin monomer is 5-hexen-1-ol.

The functionalized polyolefin polymer having the carboxylic acid containing olefin monomer or the hydroxyl group containing olefin monomer, may for example be prepared by a solution process using a protected carboxylic acid containing olefin monomer or a protected hydroxyl group containing olefin monomer. Non-limiting examples of protection group includes silyl halides, trialkyl aluminum complexes, dialkyl aluminum alkoxide complexes, dialkyl magnesium complexes, dialkyl zinc complexes and trialkyl boron complexes, alumina based compounds and complexes.

A purification step or a de-ashing step involving the removal of the protective agent that remain as impurities in the resin after the production process, is particularly preferred for the functionalized polyolefin polymer especially for encapsulant film application for a photovoltaic module. By performing the purification (de-ashing) step, the film demonstrates improved adhesive strength and desirably increased volume resistivity. Inventors believe that by removing the protection groups from the resin, enables the film to have more hydroxyl functionalities available for enhancing both adhesive property and volume resistivity of the film.

Esterified Olefin Monomer

In some embodiments of the invention, the functionalized olefin monomer is an esterified olefin monomer represented by the formula:

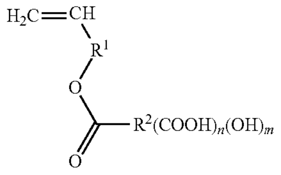

wherein $R^1$ is selected from a hydrocarbyl group having 2 to 10 carbon atoms, preferably 2 to 6 carbon atoms, more preferably 4 or 6 carbon atoms;

wherein $R^2$ is selected from a hydrocarbyl group having 2 to 10 carbon atoms, and wherein 'n' is an integer from 1 to 3 and 'm' is an integer from 0 to 4, preferably 1 to 4.

Accordingly, in some embodiments of the invention, the propylene copolymer may for example comprise polymeric units derived from propylene and polymeric units derived from the esterified olefin monomer.

In some embodiments of the invention, the propylene terpolymer may for example comprise (i) polymeric units derived from propylene, (ii) polymeric units derived from the first olefin monomer comprising either 2, or 4 to 8 carbon atoms, preferably the first olefin monomer comprises 2 or 6 carbon atoms, preferably the first olefin monomer comprises 6 carbon atoms, and (iii) polymeric units derived from the esterified olefin monomer.

In some embodiments of the invention, the ethylene terpolymer may for example comprise (i) polymeric units derived from ethylene, (ii) polymeric units derived from the second olefin monomer comprising 3 to 8 carbon atoms, preferably the second olefin monomer comprises 8 carbon atoms, and (iii) polymeric units derived from the esterified olefin monomer.

The functionalized polyolefin polymer comprising polymeric units derived from the esterified olefin monomer may for example be prepared by first obtaining an intermediate functionalized polyolefin polymer using a solution process. The intermediate functionalized polyolefin polymer may for example comprise polymeric units derived from propylene, optionally polymeric units derived from the first monomer and polymeric units derived from the carboxylic acid containing olefin monomer or the hydroxyl group containing olefin monomer.

Alternatively, the intermediate functionalized polyolefin polymer may for example comprise polymeric units derived from ethylene, the second monomer and polymeric units derived from the carboxylic acid containing olefin monomer or the hydroxyl group containing olefin monomer.

Subsequently, the intermediate functionalized polyolefin polymer may be esterified with a poly-acid or the corresponding acid anhydride, preferably a di-acid or tri-acid moiety to obtain the functionalized polyolefin polymer comprising polymeric units derived from the esterified olefin monomer. The poly-acid may for example have one or more hydroxyl group functionality. The step of esterification by a poly-acid or poly-acid anhydride can be performed using a solution process or during a reactive extrusion melt process.

The poly-acid and its corresponding acid anhydride may for example be selected from citric acid, citric acid anhydride, gluconic acid, glucaric acid, isocitric acid, tartaric acid, succinic acid, succinic acid anhydride, fumaric acid, malic acid, maleic acid anhydride, itaconoic acid, itaconoic acid anhydride, oxalic acid, trimesic acid, 1,2,4-benzenetricarboxylix-1,2-anhydride, propan-1,2-3-tricarboxylic acid, 2-phosphonobutane-1,2,4-tricarboxylic acid (PBTC), preferably the poly-acid is citric acid.

For the purpose of illustration, a propylene terpolymer as the intermediate functionalized polyolefin polymer such as (poly(propylene-co-1-hexene-co-5-hexen-1-ol)) represented by the formula (poly($C_3$-co-$C_6$-co-$C_6$OH)) may be obtained by polymerizing propylene, 1-hexene and 5-hexen-1-ol in solution. Subsequently, propylene terpolymer may be esterified with citric acid to obtain a propylene terpolymer comprising polymeric units derived from propylene, 1-hexene and an esterified olefin monomer.

Preferred Functionalized Polyolefin Polymer

In some embodiments of the invention, the functionalized polyolefin polymer is selected from poly($C_3$-co-$C_2$-co-$C_6$OH), poly($C_3$-co-$C_4$-co-$C_6$OH), poly($C_3$-co-$C_6$-co-$C_6$OH), poly($C_3$-co-$C_8$-co-$C_6$OH), poly($C_3$-co-$C_6$OH), poly($C_3$-co-$C_2$-co-$C_6$OX), poly($C_3$-co-$C_6$-co-$C_6$OX), or combinations thereof, preferably the functionalized polyolefin polymer is selected from poly($C_3$-co-$C_2$-co-$C_6$OH), poly($C_3$-co-$C_4$-co-$C_6$OH), poly($C_3$-co-$C_6$-co-$C_6$OH), poly($C_3$-co-$C_6$-co-$C_6$OX), more preferably the functionalized polyolefin polymer is poly($C_3$-co-$C_6$-co-$C_6$OH), wherein $C_2$ represents ethylene monomer, $C_3$ represents propylene monomer, $C_4$ represents 1-butene monomer, $C_6$ represents 1-hexene monomer, $C_8$ represents 1-octene monomer and $C_6$OH represents 5-hexen-1-ol monomer, and 'X' represents a moiety derived from citric acid, citric acid anhydride, gluconic acid, glucaric acid, isocitric acid, tartaric acid, succinic acid, succinic acid anhydride, fumaric acid, malic acid, maleic acid anhydride, itaconoic acid, itaconoic acid anhydride, oxalic acid, trimesic acid, 1,2,4-benzenetricarboxylix-1,2-anhydride, propan-1,2-3-tricarboxylic acid, 2-phosphonobutane-1,2,4-tricarboxylic acid (PBTC), preferably 'X' is a moiety derived from citric acid.

Preferably, the film comprises a functionalized polyolefin polymer, wherein the functionalized polyolefin polymer is poly($C_3$-co-$C_6$-co-$C_6$OH) wherein $C_3$ represents propylene monomer, $C_6$ represents 1-hexene monomer, and $C_6$OH represents 5-hexen-1-ol monomer, and wherein the functionalized polyolefin polymer comprises ≤0.8 wt %, preferably ≤0.5 wt %, preferably ≤0.2 wt %, of inorganic metal oxide, based on the total weight of the functionalized polyolefin polymer and determined using Inductively Coupled Plasma Mass Spectrometry, preferably the inorganic metal oxide comprises a metal selected from Group 13 (Group III) of the Periodic Table, preferably the inorganic metal oxide is alumina.

Preferably, the functionalized polyolefin polymer is (poly(propylene-co-1-hexene-co-5-hexen-1-ol)) represented by the formula (poly($C_3$-co-$C_6$-co-$C_6$OH)) wherein polymeric units derived from propylene is 91.2 mol %, polymeric units derived from 1-hexene is 8.5 mol %, and polymeric units derived from 5-hexen-1-ol content is 0.3 mol %, wherein the functionalized polyolefin polymer comprises ≤0.8 wt %, preferably ≤0.5 wt %, preferably ≤0.2 wt %, of alumina determined using Inductively Coupled Plasma Mass Spectrometry.

Alternatively, in some embodiments of the invention, the functionalized polyolefin polymer is (poly(propylene-co-1-hexene-co-5-hexen-1-ol)) represented by the formula (poly($C_3$-co-$C_6$-co-$C_6$OH)) wherein polymeric units derived from propylene is 88.0 mol %, polymeric units derived from 1-hexene is 11.5 mol %, and polymeric units derived from 5-hexen-1-ol is 0.5 mol %, wherein the functionalized polyolefin polymer comprises ≤0.8 wt %, preferably ≤0.5 wt %, preferably ≤0.2 wt %, of alumina determined using Inductively Coupled Plasma Mass Spectrometry.

Preferably, the functionalized polyolefin polymer is (poly (propylene-co-1-hexene-co-5-hexen-1-ol)) represented by the formula (poly($C_3$-co-$C_6$-co-$C_6$OH)) wherein polymeric units derived from propylene is 95.0 mol %, polymeric units derived from 1-hexene is 4.5 mol %, and polymeric units derived from 5-hexen-1-ol content is 0.5 mol %, wherein the functionalized polyolefin polymer comprises ≤0.8 wt %, preferably ≤0.5 wt %, preferably ≤0.2 wt %, of alumina determined using Inductively Coupled Plasma Mass Spectrometry.

Ash Content and Polar Functionalization

Advantageously, the film comprising the functionalized polyolefin polymer has a sufficiently low ash content or in other words sufficiently low inorganic metal oxide content. Inorganic metal oxide such as alumina may be regarded as impurities often derived from residual traces of the catalyst composition (comprising co-catalyst or catalyst activator) ordinarily used for preparing the functionalized polyolefin polymer. Alternatively, inorganic metal oxide may also originate from scavenger/protective agent that may be used for protecting hydroxyl or carboxylic acid functional groups present in the functionalized polyolefin polymer.

It is suspected that the presence of the inorganic metal oxide beyond a certain threshold limit (or concentration) may adversely affect the performance of the film as an encapsulant for a photovoltaic module. For example, if the film has a high metal oxide content (e.g. greater than 0.8 wt %,), the film may be rendered stiff affecting its processability. Further, at such high content of inorganic metal oxide may also affect the film's thermal and volume resistivity properties, thereby lowering its utility as an encapsulant film for a photovoltaic module, which require high electrical resistivity.

Preferably, in some embodiments of the invention, the functionalized polyolefin polymer comprises ≤0.8 wt %, preferably ≤0.5 wt %, preferably ≤0.2 wt %, of inorganic metal oxide, based on the total weight of the functionalized polyolefin polymer and determined using Inductively Coupled Plasma Mass Spectrometry, preferably the inorganic metal oxide comprises a metal selected from Group 13 (Group III) of the Periodic Table, preferably the inorganic metal oxide is alumina.

More preferably, in some embodiments of the invention, the functionalized polyolefin polymer comprises ≥0.0 wt % and ≤0.8 wt %, preferably ≥0.0 wt % and ≤0.5 wt %, preferably ≥0.0 wt % and ≤0.2 wt %, preferably ≥0.0 wt % and ≤0.1 wt %, of inorganic metal oxide, based on the total weight of the functionalized polyolefin polymer and determined using Inductively Coupled Plasma Mass Spectrometry, preferably the inorganic metal oxide comprises a metal selected from Group 13 (Group III) of the Periodic Table, preferably the inorganic metal oxide is alumina or its hydrated analogues, aluminum hydroxide oxide or aluminum hydroxide.

The Inductively Coupled Plasma Mass Spectrometry (ICP-MS) may for example be performed by contacting a film sample under heat with a mineral acid such as nitric acid in a closed pressure vessel. The pressure vessel may for example be heated using microwave technology. The analysis is controlled via temperature and pressure sensors. The closed pressure vessel may for example be manufactured using fluoro polymers (PTFE-TFM) or Quartz. The polymeric portion of the film sample may be disintegrated through the oxidative reaction of the acid to form carbon dioxide, water and nitrogen oxides while the residual metal oxide is converted to the corresponding nitrates, the content of which can be determined using ICP-MS to determine the amount of metal oxide present in the film sample. In other words, the ICP-MS analysis process involves a microwave assisted acid digestion process of a polymer sample using nitric acid followed by Inductively Coupled Plasma Mass Spectrometry analysis. In some aspects of the invention the Inductively Coupled Plasma Mass Spectrometry (ICP-MS) may be performed in accordance with IS024047:2021.

Advantageously, the functionalized polyolefin polymer has a suitable content of polar functional groups such as a hydroxyl functional group, which impart the desired adhesion properties to the film. It is believed that the tunable functionality of these functionalized polyolefin polymer renders these class of polymers particularly suitable for gluing the polymers to various substrates such as metals, glass, wood and polar polymers. The general apolar nature of the functionalized polyolefin polymer furthermore provides excellent adhesion to low surface energy substrates such as polyolefins (i.e. HDPE, LDPE, LLDPE, PP), especially to the front and back layers of a photovoltaic module.

The polar groups such as the hydroxyl group may for example be determined using a $^1$H NMR spectrum. Such an analysis may for example be carried out at 130° C. using deuterated tetrachloroethane (TCE-D2) as a solvent and recorded in a 5.0 mm tube on a Varian Mercury spectrometer operating at a frequency of 400 MHz. Chemical shifts may be reported in ppm versus tetramethylsilane and determined by reference relative to the solvent protons.

Preferably, the functionalized polyolefin polymer has:

i) an inorganic metal oxide content of ≥0.0 wt % and 0.8 wt %, preferably ≥0.0 wt % and ≤0.3 wt %, preferably ≥0.0 wt % and ≤0.2 wt %, preferably ≥0.01 wt % and ≤0.1 wt %, preferably ≥0.1 wt % and ≤0.2 wt %, based on the total weight of the functionalized polyolefin copolymer and determined using Inductively Coupled Plasma Mass Spectrometry; and ii) a hydroxyl functional group content of ≥0.1 and ≤1.0 mol %, preferably ≥0.2 and ≤0.8 mol %, preferably ≥0.2 and ≤0.6 mol %, when determined using NMR spectroscopy.

Stabilizers and Additives in the Film

Preferably, the film comprising the functionalized polyolefin polymer may further comprise: ≥0.05 wt % and ≤5.0 wt % of one or more additives; with regard to the total weight of the film. The one or more additives may be selected from anti-oxidants, heat stabilizers, acid scavengers, plasticizers, hindered amine light stabilizer, antistatic additive, non-phenolic processing stabilizer, lubricants, scratch resistance agents, recycling additives, clarifying agent, processing stabilizers, microbials, anti-fogging additives, anti-blocking additives, non-phenolic processing stabilizer, and combinations thereof.

Properties of the Functionalized Polyolefin Polymer

The functionalized polyolefin polymer has a suitable balance of properties as required for the functionalized polyolefin polymer to be used as an encapsulant film.

Preferably, the functionalized polyolefin polymer has:

i) an inorganic metal oxide content of ≥0.0 wt % and ≤0.8 wt %, preferably ≥0.0 wt % and 0.3 wt %, preferably ≥0.0 wt % and 0.2 wt %, preferably ≥0.01 wt % and 0.1 wt %, preferably ≥0.1 wt % and ≤0.2 wt %, based on the total weight of the functionalized polyolefin copolymer and determined using Inductively Coupled Plasma Mass Spectrometry; and/or ii) a peak melting temperature ($T_m$) of ≥50.0° C. and ≤120.0° C., preferably ≥70.0° C. and ≤100.0° C., preferably ≥75.0° C. and ≤95.0° C., preferably ≥75.0° C. and ≤90.0° C. as determined using differential scanning calorimetry (DSC) in accordance with ASTM D3418 (2008).

Preferably, the functionalized polyolefin polymer has:

i) a hydroxyl functional group content of ≥0.1 and ≤1.0 mol %, preferably ≥0.2 and 0.8 mol %, preferably ≥0.2 and 0.6 mol %, when determined using NMR spectroscopy; and/or ii) a Polydispersity Index (PDI) of ≥1.5 and ≤6.0, preferably ≥2.0 and ≤6.0, preferably ≥4.0 and ≤6.0, wherein PDI is calculated by dividing the weight average molecular weight ($M_W$) by the number average molecular weight ($M_n$) and wherein each of $M_W$ and $M_n$ are determined in accordance with ASTM D6474-12.

Preferably, the functionalized polyolefin polymer has:

i) a weight average molecular weight ($M_W$) ≥75.0 kg/mol and ≤150.0 kg/mol, preferably ≥100.0 kg/mol and ≤150.0 kg/mol, and determined in accordance with ASTM D6474-12; and/or ii) a crystallization temperature ($T_c$) of ≥20° C. and ≤80° C., preferably ≥40° C. and ≤60° C., preferably ≥35° C. and ≤55° C., preferably ≥35° C. and ≤50° C. as determined using differential scanning calorimetry (DSC) in accordance with ASTM D3418 (2008); and/or iii) a glass transition temperature ($T_g$) of ≥−50.0° C. and ≤5.0° C., preferably −10.0° C. and ≤2.0° C., preferably ≥−5.0° C. and ≤2.0° C., preferably ≥−2.0° C. and ≤−1.0° C. as determined using dynamic mechanical thermal analysis (DMTA) in accordance with ISO 6721-10:2015.

More preferably, the functionalized polyolefin polymer has:

i) an inorganic metal oxide content of ≥0.0 wt % and ≤0.8 wt %, preferably ≥0.0 wt % and ≤0.3 wt %, preferably ≥0.0 wt % and ≤0.2 wt %, preferably ≥0.01 wt % and ≤0.1 wt %, preferably ≥0.1 wt % and ≤0.2 wt %, based on the total weight of the functionalized polyolefin copolymer and determined using Inductively Coupled Plasma Mass Spectrometry; and/or ii) a peak melting temperature ($T_m$) of ≥50.0° C. and ≤120.0° C., preferably ≥70.0° C. and ≤100.0° C., preferably ≥75.0° C. and ≤95.0° C., preferably ≥75.0° C. and ≤90.0° C. as determined using differential scanning calorimetry (DSC) in accordance with ASTM D3418 (2008); and/or iii) a hydroxyl functional group content of ≥0.1 and ≤1.0 mol %, preferably ≥0.2 and ≤0.8 mol %, preferably ≥0.2 and ≤0.6 mol %, when determined using NMR spectroscopy; and/or iv) a Polydispersity Index (PDI) of ≥1.5 and ≤6.0, preferably ≥2.0 and ≤6.0, preferably ≥4.0 and ≤6.0, wherein PDI is calculated by dividing the weight average molecular weight ($M_W$) by the number average molecular weight ($M_n$) and wherein each of $M_W$ and $M_n$ are determined in accordance with ASTM D6474-12; and/or v) a weight average molecular weight ($M_W$) ≥75.0 kg/mol and ≤150.0 kg/mol, preferably ≥100.0 kg/mol and ≤150.0 kg/mol and determined in accordance with ASTM D6474-12; and/or vi) a crystallization temperature ($T_c$) of ≥20° C. and ≤80° C., preferably ≥40° C. and ≤60° C., preferably ≥35° C. and ≤55° C., preferably ≥35° C. and ≤50° C. as determined using differential scanning calorimetry (DSC) in accordance with ASTM D3418 (2008); and/or vii) a glass transition temperature ($T_g$) of ≥−50.0° C. and ≤5.0° C., preferably ≥−10.0° C. and ≤2.0° C., preferably ≥−5.0° C. and ≤2.0° C., preferably ≥−2.0° C. and ≤−1.0° C. as determined using dynamic mechanical thermal analysis (DMTA) in accordance with ISO 6721-10:2015.

More preferably, the functionalized polyolefin polymer has:

i) an inorganic metal oxide content of ≥0.0 wt % and ≤0.8 wt %, preferably ≥0.0 wt % and 0.3 wt %, preferably ≥0.0 wt % and 0.2 wt %, preferably ≥0.01 wt % and ≤0.1 wt %, preferably ≥0.1 wt % and ≤0.2 wt %, based on the total weight of the functionalized polyolefin copolymer and determined using Inductively Coupled Plasma Mass Spectrometry;

ii) a peak melting temperature ($T_m$) of ≥50.0° C. and ≤100.0° C., preferably ≥70.0° C. and ≤100.0° C., preferably ≥75.0° C. and ≤95.0° C., preferably ≥75.0° C. and ≤90.0° C. as determined using differential scanning calorimetry (DSC) in accordance with ASTM D3418 (2008);

iii) a hydroxyl functional group content of ≥0.1 and ≤1.0 mol %, preferably ≥0.2 and ≤0.8 mol %, preferably ≥0.2 and ≤0.6 mol %, when determined using NMR spectroscopy;

iv) a Polydispersity Index (PDI) of ≥1.5 and ≤6.0, preferably ≥2.0 and ≤6.0, preferably ≥4.0 and ≤6.0, wherein PDI is calculated by dividing the weight average molecular weight ($M_W$) by the number average molecular weight ($M_n$) and wherein each of $M_W$ and $M_n$ are determined in accordance with ASTM D6474-12;

v) a weight average molecular weight ($M_W$) ≥75.0 kg/mol and ≤150.0 kg/mol, preferably ≥100.0 kg/mol and ≤150.0 kg/mol and determined in accordance with ASTM D6474-12;

vi) a crystallization temperature ($T_c$) of ≥20° C. and ≤80° C., preferably ≥40° C. and ≤60° C., preferably ≥35° C. and ≤55° C., preferably ≥35° C. and ≤50° C. as determined using differential scanning calorimetry (DSC) in accordance with ASTM D3418 (2008); and vii) a glass transition temperature ($T_g$) of ≥−50.0° C. and ≤5.0° C., preferably −10.0° C. and ≤2.0° C., preferably ≥−5.0° C. and ≤2.0° C., preferably ≥−2.0° C. and ≤−1.0° C. as determined using dynamic mechanical thermal analysis (DMTA) in accordance with ISO 6721-10:2015.

Properties of the Film Comprising the Functionalized Polyolefin Polymer

The film of the present invention comprising the functionalized polyolefin polymer, demonstrates suitable properties of electrical resistivity, optical and mechanical properties as required for the film to be used as an encapsulant film for a photovoltaic module.

Preferably, the film exhibits a volume resistivity of ≥1.0×$10^{13}$ and ≤3.0×$10^{16}$, preferably ≥1.0×$10^{14}$ and ≤2.5×$10^{15}$, preferably ≥1.0×$10^{14}$ and ≤2.0×$10^{14}$ when determined in accordance with ASTM D257-14 (2021) at an applied voltage of 1000V for a time period of 600 seconds and at a temperature of 25° C. At such volume resistivity, the film has the desired electrical resistivity required for a photovoltaic module.

Preferably, the film exhibits:

a. a volume resistivity of ≥1.0×$10^{13}$ and ≤3.0×$10^{16}$, preferably ≥1.0×$10^{14}$ and ≤2.5×$10^{15}$, preferably ≥1.0×$10^{14}$ and ≤2.0×$10^{14}$ when determined in accordance with ASTM D257-14 (2021) at an applied voltage of 1000V for a time period of 600 seconds and at a temperature of 25° C.; and/or b. an optical transmittance of ≥30.0% and ≤95.0%, preferably ≥40.0% and ≤95.0%, preferably ≥44.0% and ≤85.0%, preferably ≥45.0% and ≤60.0%, preferably ≥45.0% and ≤50.0%, when determined in accordance with ASTM D1003 (2021).

Preferably, the film exhibits:

a. a tensile strength at break of ≥15.0 MPa and ≤60.0 MPa, preferably ≥15.0 MPa and ≤60.0 MPa, preferably ≥20.0 MPa and ≤40.0 MPa, preferably ≥22.0 MPa and ≤30.0 MPa, when determined in accordance with ASTM D882 (2018); and/or b. a tensile modulus of ≥30.0 MPa and ≤130.0 MPa, preferably ≥30.0 MPa and ≤100.0 MPa, preferably ≥30.0 MPa and ≤80.0 MPa, preferably ≥30.0 MPa and ≤60.0 MPa, preferably ≥35.0 MPa and ≤55.0 MPa, preferably ≥40.0 MPa and ≤50.0 MPa, when determined in accordance with ASTM D882 (2018).

More preferably, the film exhibits:

a. a volume resistivity of $\geq 1.0\times10^{13}$ and $\leq 3.0\times10^{16}$, preferably $\geq 1.0\times10^{14}$ and $\leq 2.5\times10^{15}$, preferably $\geq 1.0\times10^{14}$ and $\leq 2.0\times10^{14}$ when determined in accordance with ASTM D257-14 (2021) at an applied voltage of 1000 V for a time period of 600 seconds and at a temperature of 25° C.;

b. an optical transmittance of ≥30.0% and ≤95.0%, preferably ≥40.0% and ≤95.0%, preferably ≥44.0% and ≤85.0%, preferably ≥45.0% and ≤60.0%, preferably ≥45.0% and ≤50.0%, when determined in accordance with ASTM D1003 (2021);

c. a tensile strength at break of ≥15.0 MPa and ≤60.0 MPa, preferably ≥15.0 MPa and ≤60.0 MPa, preferably ≥20.0 MPa and ≤40.0 MPa, preferably ≥22.0 MPa and ≤30.0 MPa, when determined in accordance with ASTM D882 (2018); and d. a tensile modulus of 30.0 MPa and ≤130.0 MPa, preferably ≥30.0 MPa and ≤100.0 MPa, preferably ≥30.0 MPa and ≤80.0 MPa, preferably ≥30.0 MPa and ≤60.0 MPa, preferably ≥35.0 MPa and ≤55.0 MPa, preferably ≥40.0 MPa and ≤50.0 MPa, when determined in accordance with ASTM D882 (2018).

The film may for example have a suitable moisture barrier property. For example the film of the present invention has a Water Vapor Transmission Rate (WVTR) of ≥0.5 $g/(m^2 \cdot day)$ and ≤8.0 $g/(m^2 \cdot day)$, when determined at 23° C. at 85% relative humidity ($R_H$) in accordance with ASTM F1249.

Preparation of the Film comprising the Functionalized Polyolefin Polymer

The film comprising the functionalized polyolefin polymer may be prepared by using a suitable process such as film extrusion/casting, or by compression molding. Accordingly, in some aspects of the invention, the invention relates to a process for preparing the film according to any one or more embodiments of the present invention, wherein the process comprises at least one step involving any one of (i) film extrusion and casting, or (ii) compression molding. Preferably the process for preparing the film comprises a step of film extrusion and casting, comprising the steps of:

a. providing the functionalized polyolefin polymer according to one or more embodiments of the present invention;

b. extruding the functionalized polyolefin polymer at a melt temperature of ≤225° C. and forming and extrudate; and c. cooling the extrudate and forming the film.

In some embodiments of the invention, the extrusion is carried out at a melt temperature of ≤225° C., preferably ≤210° C., preferably ≤210° C. Preferably, the extrusion is carried out at a melt temperature of ≥140° C. and ≤225° C., preferably ≥150° C. and ≤210° C., preferably ≥160° C. and ≤200° C. and forming the extrudate.

The cooling of the extrudate may involve the step of casting the film. For example, the process for preparing the film comprises a step of casting the extrudate at a temperature of ≤100° C. and forming the film. The casting of the film may for example be carried out at any suitable temperature of ≥70° C. and ≤100° C. In some embodiments of the invention, the film so obtained may be further heated and subsequently stretched to form an oriented film, for example a bi-directionally oriented film.

Alternatively, in some aspects of the invention, the invention relates to a process for preparing the film according to one or more embodiments of the present invention, wherein the process comprises the step of compression molding, comprising the steps of:

a. providing the functionalized polyolefin polymer according to one or more embodiments of the present invention;

b. heating the functionalized polyolefin polymer at any temperature ≥150° C. and ≤225° C., preferably ≥160° C. and ≤200° C., and forming a precursor molten film;

c. applying a compression force of ≥50 kN and ≤150 kN, preferably ≥80 kN and ≤120 kN on the precursor film for a time period of ≥1.0 minute and ≤15.0 minutes, preferably ≥2.0 minutes and ≤8.0 minutes; and d. cooling the precursor molten film to a temperature of ≥35° C. and ≤50° C. at a cooling rate of 10° C./min and under a compression force of ≥50 kN and ≤150 kN, preferably ≥80 kN and ≤120 kN and forming the precursor film; and e. removing the compression force and cooling the precursor film to ambient room temperature to obtain the film.

Optionally, the precursor molten film may be stabilized in the absence of any compression force for a time period of ≥1.0 minute and ≤15.0 minutes, preferably ≥2.0 minutes and ≤8.0 minutes prior to application of the compression force. The film, once formed, may be used for forming encapsulating or sealing layers suitable to be used in photovoltaic modules or other electronic modules. The film may have a suitable thickness as may be required for a particular application. For example, the film has a cross-sectional thickness of ≥200 μm and ≤3000 μm, preferably ≥200 μm and ≤800 μm, preferably ≥300 μm and ≤500 μm.

Solar Cell Application:

Accordingly, in some embodiments of the invention, the invention is directed to an encapsulated solar cell comprising a solar cell positioned between a first encapsulant layer and a second encapsulant layer, wherein at least one of the first encapsulant layer or the second encapsulant layer, preferably each of the first encapsulant layer and the second encapsulant layer, comprises or consists of the film according to one or more embodiments of the present invention, further wherein the solar cell is positioned such that the first encapsulant layer and the second encapsulant layer are joined so as to at least partially encapsulate the solar cell.

Solar cell used for the context of the present invention are known to a person skilled in the art. For example, the solar cell may be any standard commercially available crystalline or amorphous silicon solar cell or CIGS (copper indium gallium selenide) thin film. The person skilled in the art may know what type of electrical connection to use, for example electrical conductors may be metal strips such as strips comprising copper aluminum and/or silver or, in the alternative, may be metal wires.

In some aspects of the invention, the invention is directed to a photovoltaic module comprising the encapsulated solar cell in accordance with the present invention, preferably wherein the photovoltaic module comprises:

a. a front layer;
b. a back layer; and
c. the encapsulated solar cell, wherein the encapsulated solar cell is positioned between the front layer and the back layer preferably such that the front layer is in direct contact with the first encapsulant layer and the second encapsulant layer is in direct contact with the back layer.

In some embodiments of the invention, the invention is directed to a photovoltaic module comprising the encapsulated solar cell in accordance with the present invention, preferably wherein the photovoltaic module comprises in the order of:

a. a front layer;
b. a first encapsulant layer;
c. a solar cell;
d. a second encapsulant layer; and
e. a back layer;

wherein the solar cell is positioned between the first encapsulant layer and the second encapsulant layer, preferably the front layer is in direct contact with the first encapsulant layer and the second encapsulant layer is in direct contact with the back layer.

In some embodiments of the invention, the front layer and/or the back layer comprises a material selected from the group consisting of a polypropylene composition, glass, polycarbonate composition, and any combinations thereof, preferably the front layer and/or the back layer comprise(s) a polypropylene composition. The polypropylene composition may for example comprise a polypropylene homopolymer in particular an iso-tactic polypropylene (iPP). Alternatively, the polypropylene composition may for example be a propylene-ethylene random copolymer (random PP) optionally comprising inorganic fillers such as glass or talcum.

In some embodiments of the invention, the front layer and/or the back layer comprises a polypropylene composition. The front layer suitable for the present invention may for example be identical to that described on pages 3-9 of the published patent application WO2021053180A1 while the back layer suitable for the present invention may for example be 15 identical to that described on pages 12-17 of the published patent application WO2021053180A1.

In addition to the front layer, the sealing layer and the back layer, the photovoltaic module may further comprise additional layers such as a protective (UV and/or fire) coating on the sunlight facing side of the front layer. Preferably, the photovoltaic module of the invention does not comprise a metal layer, rendering the process of recycling of the photovoltaic module of the invention easier.

The photovoltaic module may for example be manufactured by a suitable process. For example, in some aspects of the invention, the invention is directed to process for making the photovoltaic module in accordance with one or more embodiments of the invention, wherein the process comprises the step of:

a) assembling the front layer, the first encapsulant layer, the solar cell, the second encapsulant layer and the back layer to form a photovoltaic assembly such that the solar cell is positioned between the first encapsulant layer and the second encapsulant layer, preferably such that the front layer is in direct contact with the first encapsulant layer; and the second encapsulant layer is in direct contact with the back layer;
b) heating the photovoltaic assembly at a temperature such that at least a portion of the first encapsulant layer and the second encapsulant layer melt to form a melted photovoltaic assembly comprising the solar cell;
c) pressing the melted photovoltaic assembly under heated conditions and forming the laminated photovoltaic module; and
d) cooling the laminated photovoltaic module to ambient temperature and obtaining the photovoltaic module.

Preferably, the ambient temperature suitable for the process for producing the photovoltaic module may be ≥15.0° C. and ≤35.0° C., preferably ≥20.0° C. and ≤35.0° C.

Preferably, the photovoltaic assembly is heated at any temperature of ≥110.0° C. and ≤180.0° C., preferably ≥120.0° C. and ≤170.0° C., preferably ≥125.0° C. and ≤165.0° C., preferably ≥130.0° C. and ≤160.0° C. Preferably in the heating step, the assembly is heated to a temperature such that the front and back layer do not melt, for example the temperature of this heating step is chosen such that the front layer obtains a temperature of at least 5° C. below the melting temperature of the front layer.

In practice, the temperature of the heating step is chosen as high as possible so as to allow maximum adherence between the first encapsulant layer and the front layer and the adhesion of the second encapsulant layer and the back layer, while ensuring that the polymeric front and the back layer does not melt.

During such lamination process, the structural integrity of the back layer and of the assembly is maintained and the photovoltaic module of the invention can be prepared with consistent dimensions. Furthermore, lamination is an easy process which has short cycle times as it can be performed at high speed. It should be clear to the person skilled in the art, that the layers may also be laminated in part. For example the front and the first encapsulating layer may first be laminated onto one another, after which the laminated front and sealing layer may be laminated onto the back layer.

Specific examples demonstrating some of the embodiments of the invention are included below. The examples are for illustrative purposes only and are not intended to limit the invention. It should be understood that the embodiments and the aspects disclosed herein are not mutually exclusive and such aspects and embodiments can be combined in any way. Those of ordinary skill in the art will readily recognize parameters that can be changed or modified to yield essentially the same results.

EXAMPLES

Purpose: For the purposes of exemplifying the present invention, three film samples were prepared. Film sample 'IE' represent a film in accordance with the present invention, inventive formulations, the films CE1 and CE2 are comparative formulations, whose performance is compared with. The details of the film samples are provided below:

TABLE 1

| Example | Polymer | Description |
|---|---|---|
| IE (Inventive) De-ashed film sample | poly ($C_3$-co-$C_6$-co-$C_6$OH) | A terpolymer having polymeric units derived from propylene, 1-hexene and 5-hexen-1-ol monomer. (Inorganic metal oxide) Alumina content is 0.168 wt. %. $C_3$ (propylene) content is 91.2 mol. % $C_6$ (1-hexene) content is 8.5 mol. % $C_6$OH (5-hexen-1-ol) content is 0.3 mol. % Hydroxyl group content is 0.3 mol. % |
| CE1 (Comparative) The sample was not de-ashed. | poly ($C_3$-co-$C_6$-co-$C_6$OH) | A terpolymer having polymeric units derived from propylene, 1-hexene and 5-hexen-1-ol monomer. (Inorganic metal oxide) Alumina content is 0.876 wt. %. $C_3$ (propylene) content is 91.2 mol. % $C_6$ (1-hexene) content is 8.5 mol. % $C_6$(OH) (5-hexen-1-ol) content is 0.3 mol. % Hydroxyl group content is 0.3 mol. % |
| CE2 (Comparative) | POE-g-Si(OR)$_3$ | Ethylene copolymer grafted with alkoxy-silane. |

Method of preparation of the functionalized polyolefin polymer Poly ($C_3$-co-$C_6$-co-$C_6$OH): The polymerization experiment was carried out using a stainless steel BÜCHI reactor (2 L) filled with pentamethylheptane (PMH) solvent (1 L) using a stirring speed of 600 rpm. Catalyst and comonomer solutions were prepared in a glove box under an inert dry nitrogen atmosphere.

The reactor was first heated to 40° C. followed by the addition of TiBA (1.0 M solution in toluene, 2 mL), 1-hexene (neat 10 mL), and triethylaluminum (TEA)-pacified 5-hexen-1-ol (1.0 M solution in toluene, TEA:5-hexen-1-ol (mol ratio)=1, 10 mL). The reactor was charged at 40° C. with gaseous propylene (100 g) and the reactor was heated up to the desired polymerization temperature of 130° C. resulting in a partial propylene pressure of about 15 bar. Once the set temperature was reached, the polymerization reaction was initiated by the injection of the pre-activated catalyst precursor bis((2-oxoyl-3-(dibenzo-1H-pyrrole-1-yl)-5-(methyl)phenyl)-2-phenoxy)-2,4-pentanediylhafnium (IV) dimethyl [CAS 958665-18-4]; other name hafnium [[2',2'''-[(1,3-dimethyl-1,3-propanediyl)bis(oxy-κO)]bis[3-(9H-carbazol-9-yl)-5-methyl[1,1'-biphenyl]-2-olato-κO]](2-)]dimethyl](Hf-04, 2 μmol) in MAO (30 wt % solution in toluene, 11.2 mmol). The reaction was stopped by pouring the polymer solution into a container flask containing demineralized water/iPrOH (50 wt %, 1 L) and Irganox 1010 (1.0 M, 2 mmol). The resulting suspension was filtered and dried at 80° C. in a vacuum oven, prior the addition of Irganox 1010 as an antioxidant. The poly(propylene-co-1-hexene-co-5-hexen-1-ol) (25.6 g) was obtained as a white powder.

Process of de-ashing: The copolymer obtained from the solution process may be de-ashed in order to remove trace of protective compounds used during polymer synthesis or remove traces of alumina derived from catalyst residues. To do so the polymer (10 g) was dispersed in mixture of dry toluene (400 ml) and concentrated (37%) HCl (10 ml, 0.13 mol, 4.74 g) and heated under reflux until the terpolymer dissolved. Once the polymer was properly dissolved, methanol (250 ml) was added to the hot mixture and the mixture was heated under stirring at 90-100° C. for 1 additional hour. Then the polymer was precipitated in cold methanol, filtered and washed 2× with methanol and dried at 60° C. under reduced pressure.

Process of preparing the film: The film samples, were prepared via compression-molding using PP ISO settings on LabEcon 600 high-temperature press (Fontijne Presses, the Netherlands). The compression-molding cycle was applied: heating to 180° C., stabilizing for 5 min with no force applied, 5 min with 100 kN normal force and cooling down to 40° C. with 10° C./min and 100 kN normal force and obtaining the film.

Testing Parameters and methodology: The evaluation parameters were determined in accordance with the methodology provided below:

Procedure to determine alumina content (ICP-MS test method): De-ashed poly($C_3$-co-$C_6$-co-$C_6$OH) (0.3 mol % OH; PDI=4.6; 150 mg ($5.6 \cdot 10^{-6}$ mol)) was digested in 6 mL concentrated nitric acid (trace metal grade) by microwave assisted acid digestion using an Anton Paar Multiwave PRO equipped with closed high pressure Quartz digestion vessels. After the microwave digestion run, the acid was analytically transferred into a pre-cleaned plastic centrifuge tube containing 1 mL of internal standard solution and was diluted with MilliQ water up to the 50 mL mark. The elements in the sample were quantified using a multi-element calibration set from Inorganic Ventures using an Agilent 8900 ICP-MS system.

Volume resistivity: determined in accordance with ASTM D257-14 (2021) at an applied voltage of 1000V for a time period of 600 seconds and at a temperature of 25° C.

Quantity of hydroxyl functionality: The functionality level was determined by $^1$H NMR spectroscopy by comparing the integration of the $CH_2$ signals next to the hydroxyl (OH) with the integration of the resonances of the polymer backbone. Analysis was carried out at 130° C. using deuterated tetrachloroethane (TCE-D2) as solvent and recorded in 5 mm tubes on a Varian Mercury spectrometer operating at a frequency of 400 MHz. Chemical shifts are reported in ppm versus tetramethylsilane and were determined by reference to the residual solvent protons.

Peak melting temperature ($T_m$): The peak melting temperature was determined in accordance with ASTM D3418-15, using Differential Scanning Calorimetry (DSC) with a first heating and cooling cycle at a temperature between −40° C. to 230° C. and at a heating and a cooling rate of 10° C./min for a 3-6 mg film sample, using a nitrogen purge gas at a flow rate of 50±5 mL/min, followed by a second heating cycle identical to the first heating cycle.

Crystallization temperature ($T_c$): determined in accordance with ASTM D3418-15, using Differential Scanning Calorimetry (DSC) with a first heating and cooling cycle at a temperature between −40° C. to 230° C. and at a heating and a cooling rate of 10° C./min for a 3-6 mg film sample, using a nitrogen purge gas at flow rate of 50±5 mL/min, followed by a second heating cycle identical to the first heating cycle.

Weight average molecular weight ($M_W$) and Number average molecular weight ($M_n$): is determined in accordance with ASTM D6474-12.

Polydispersity Index (PDI): PDI is calculated by dividing the weight average molecular weight ($M_W$) by the number average molecular weight ($M_n$) and wherein each of $M_W$ and $M_n$ are measured in accordance with ASTM D6474-12.

Tensile modulus and Tensile strength at break: determined in accordance with ASTM D882 (2018).

Glass transition temperature ($T_2$): determined by DMTA in accordance with ISO 6721-10:2015.

Results: The results from the test analysis is provided in the table below:

TABLE 3

| Sample | Composition | $C_6$ content mol % | OH content mol % | Residues alumina wt % | Mw kg/mol | PDI — | Tm ° C. | Tc ° C. | Tg ° C. |
|---|---|---|---|---|---|---|---|---|---|
| Comparative Example (CE1) | poly ($C_3$—CO—$C_6$-co-$C_6$OH) | 0.2-0.3 | 0.4 | 0.876 | 121.2 | 4.6 | 90.8 | 60.7 | −1.7 |
| Comparative Example (CE2) | POE-g-Si(OR)$_3$ | na | na | 0.00061 | 71.7 | 3 | 73.6 | 61.8 | −33.2 |
| Inventive Example (IE) | poly ($C_3$—co-$C_6$-co-$C_6$OH) | 0.2-0.3 | 0.4 | 0.168 | 121.2 | 4.6 | 88.9 | 44.1 | 1.3 |

From the Polydispersity Index (PDI), the inventive functionalized polyolefin polymer has a higher Polydispersity Index and lower glass transition temperature Tg, indicative of improved processability of the polymer compared to the comparative polymer CE2. Further, the inventive polymer has a higher molecular weight contributing to the improved structural integrity of the film. The performance of the film samples are provided in the table below:

TABLE 3

| Sample | Volume Resistivity Ω · cm | Tensile Modulus (MPa) | Tensile strength (MPa) | Elongation at break % |
|---|---|---|---|---|
| CE1 | 1.90E+12 ($1.9 \times 10^{12}$) | 137.7 | 25.2 | 720 ± 9 |
| CE2 | 7.10E+13 ($7.1 \times 10^{13}$) | 20.1 | 9.5 | 924 ± 59 |
| IE | 1.10E+14 ($1.1 \times 10^{14}$) | 47.3 | 25.6 | 752 ± 33 |

From the data provided in Table 3, it is evident that the inventive film ‘IE’ demonstrates higher volume resistivity than that of CE1 and CE2, rendering the film to be particularly useful for application in photovoltaic module. For example, the inventive film ‘IE’ having functionalized polyolefin polymer has nearly 60 times higher volume resistivity than that of CE1, while the film ‘IE’ has a nearly 1.6 times higher volume resistivity than that of CE2. A comparison between the volume resistivity function of the inventive film ‘IE’ in comparison to ‘CE1’ indicates that a de-ashed polymer is particularly suitable for use in encapsulant films having high electrical resistance.

The inventive film ‘IE’ has a significantly lower (nearly 66% lower) tensile modulus or stiffness thereby allowing for improved processing of the film as compared to the film CE1. Further, the higher tensile strength at break for the inventive film compared to the film CE2, renders the film to have excellent mechanical properties, required for the film to be used as an encapsulant film.

Accordingly, the inventive film ‘IE’ comprising a functionalized polyolefin polymer such as propylene terpolymer of the formula poly ($C_3$-co-$C_6$-co-$C_6$OH) and having an alumina content of around 0.168 wt %, imparts the desired properties of electrical resistivity, and mechanical properties that is suitable for use as an encapsulant film for a photovoltaic module.

The invention claimed is:

1. A film comprising a functionalized polyolefin polymer, wherein the functionalized polyolefin polymer is a polymer selected from the group consisting of:

a. a propylene copolymer comprising
  i. ≥95.0 mol % and ≤99.95 mol % of polymeric units derived from propylene, and
  ii. ≥0.05 mol % and ≤5.0 mol % of polymeric units derived from a functionalized olefin monomer,
  based on the total moles of all polymeric units constituting the propylene copolymer;
b. a propylene terpolymer comprising
  i. ≥80.0 mol % and ≤98.95 mol % of polymeric units derived from propylene;
  ii. ≥0.1 mol % and ≤19.95 mol % of polymeric units derived from a first olefin monomer comprising either 2, or 4 to 8 carbon atoms; and
  iii. ≥0.05 mol % and ≤5.0 mol % of polymeric units derived from a functionalized olefin monomer,
based on the total moles of all polymeric units constituting the propylene terpolymer;
c. an ethylene terpolymer comprising:
  i. ≥80.0 mol % and ≤98.95 mol % of polymeric units derived from ethylene,
  ii. ≥0.1 mol % and ≤19.95 mol % of polymeric units derived from a second olefin monomer comprising 3 to 8 carbon atoms; and
  iii. ≥0.05 mol % and ≤5.0 mol % of polymeric units derived from a functionalized olefin monomer;
based on the total moles of all polymeric units constituting the ethylene terpolymer; and
d. a polymer mixture comprising any combination of polymers (a) to (c);
wherein the functionalized olefin monomer is a monomer selected from:
  i. a hydroxyl group containing olefin monomer having 4 to 12 carbon atoms;
  ii. a carboxylic acid containing olefin monomer having 2 to 12 carbon atoms; and iii. an esterified olefin monomer represented by the formula:

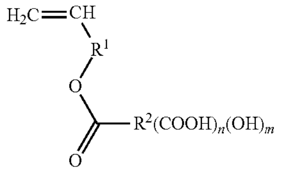

wherein $R^1$ is selected from a hydrocarbyl group having 2 to 10 carbon atoms;

wherein $R^2$ is selected from a hydrocarbyl group having 2 to 10 carbon atoms, and wherein 'n' is an integer from 1 to 3 and 'm' is an integer from 0 to 4, wherein the functionalized polyolefin polymer comprises ≤0.8 wt % of inorganic metal oxide, based on the total weight of the functionalized polyolefin polymer and determined using Inductively Coupled Plasma Mass Spectrometry.

2. The film according to claim 1, wherein (i) the carboxylic acid containing olefin monomer is selected from the group consisting of acrylic acid, 3-butenoic acid, 4-pentenoic acid, 5-hexenoic acid, 10-undecenoic acid, 5-norbornene-2-carboxylic acid and 5-norbornene-2-acetic acid; and/or wherein (ii) the hydroxyl group containing olefin monomer is selected from the group consisting of 3-buten-1-ol, 5-hexen-1-ol, 7-octen-1-ol, and 10-undecen-1-ol.

3. The film according to claim 1, wherein (i) the first olefin monomer comprising either 2 or 4 to 8 carbon atoms, is a monomer selected from the group consisting of ethylene, 1-butene, 1-hexene, 4-methyl-1-pentene, vinylcyclohexane, and 1-octene; and/or wherein (ii) the second olefin monomer comprising 3 to 8 carbon atoms is a monomer selected from the group consisting of propylene, 1-butene, 1-hexene, 4-methyl-1-pentene, vinylcyclohexane, and 1-octene.

4. The film according to claim 1, wherein the functionalized polyolefin polymer is selected from poly($C_3$-co-$C_2$-co-$C_6$OH), poly($C_3$-co-$C_4$-co-$C_6$OH), poly($C_3$-co-$C_6$-co-$C_6$OH), poly($C_3$-co-$C_8$-co-$C_6$OH), poly($C_3$-co-$C_6$OH), poly ($C_3$-co-$C_2$-co-$C_6$OX), poly($C_3$-co-$C_6$-co-$C_6$OX), and combinations thereof, wherein $C_2$ represents ethylene monomer, $C_3$ represents propylene monomer, $C_4$ represents 1-butene monomer, $C_6$ represents 1-hexene monomer, $C_8$ represents 1-octene monomer and $C_6$OH represents 5-hexen-1-ol monomer, and 'X' represents a moiety derived from citric acid, citric acid anhydride, gluconic acid, glucaric acid, isocitric acid, tartaric acid, succinic acid, succinic acid anhydride, fumaric acid, malic acid, maleic acid anhydride, itaconoic acid, itaconoic acid anhydride, oxalic acid, trimesic acid, 1,2,4-benzenetricarboxylix-1,2-anhydride, propan-1,2-3-tricarboxylic acid, 2-phosphonobutane-1,2,4-tricarboxylic acid (PBTC).

5. The film according to a claim 1, wherein the functionalized polyolefin polymer has:

i) an inorganic metal oxide content of ≥0.0 wt % and ≤0.8 wt %, based on the total weight of the functionalized polyolefin copolymer and determined using Inductively Coupled Plasma Mass Spectrometry; and/or ii) a peak melting temperature ($T_m$) of ≥50.0° C. and ≤120.0° C., as determined using differential scanning calorimetry (DSC) in accordance with ASTM D3418 (2008).

6. The film according to claim 1, wherein the functionalized polyolefin polymer has:

i) a hydroxyl functional group content of ≥0.1 and ≤1.0 mol %, when determined using NMR spectroscopy; and/or ii) a Polydispersity Index (PDI) of ≥1.5 and ≤6.0, wherein PDI is calculated by dividing the weight average molecular weight ($M_W$) by the number average molecular weight ($M_n$) and wherein each of $M_W$ and $M_n$ are determined in accordance with ASTM D6474-12.

7. The film according to claim 1, wherein the functionalized polyolefin polymer has:

i) a weight average molecular weight ($M_W$) ≥75.0 kg/mol and ≤150.0 kg/mol, determined in accordance with ASTM D6474-12; and/or ii) a crystallization temperature ($T_c$) of ≥20° C. and ≤80° C., as determined using differential scanning calorimetry (DSC) in accordance with ASTM D3418 (2008); and/or iii) a glass transition temperature ($T_g$) of ≥−50.0° C. and ≤5.0° C., as determined using dynamic mechanical thermal analysis (DMTA) in accordance with ISO 6721-10:2015.

8. The film according to claim 1, wherein the film exhibits:

a. a volume resistivity of ≥$1.0\times10^{13}$ and ≤$3.0\times10^{16}$, when determined in accordance with ASTM D257-14 (2021) at an applied voltage of 1000V for a time period of 600 seconds and at a temperature of 25° C.; and/or b. an optical transmittance of ≥30.0% and ≤95.0%, when determined in accordance with ASTM D1003 (2021).

9. The film according to claim 1, wherein the film exhibits:

a. a tensile strength at break of ≥15.0 MPa and ≤60.0 MPa, when determined in accordance with ASTM D882 (2018); and/or b. a tensile modulus of ≥30.0 MPa and ≤130.0 MPa, when determined in accordance with ASTM D882 (2018).

10. A process for preparing the film according to claim 1, wherein the process comprises at least one step involving any one of film extrusion and casting, or compression molding.

11. An encapsulated solar cell comprising a solar cell positioned between a first encapsulant layer and a second encapsulant layer, wherein at least one of the first encapsulant layer or the second encapsulant layer comprises or consists of the film according to claim 1, further wherein the solar cell is positioned such that the first encapsulant layer and the second encapsulant layer are joined so as to at least partially encapsulate the solar cell.

12. A photovoltaic module comprising the encapsulated solar cell according to claim 11.

13. The photovoltaic module of claim 12, wherein:

the photovoltaic module comprises a front layer, a back layer, and the encapsulated solar cell, wherein the encapsulated solar cell is positioned between the front layer and the back layer; and the front layer and/or the back layer comprises a material selected from the group consisting of a polypropylene composition, glass, polycarbonate composition, and any combinations thereof.

14. A process for making the photovoltaic module of claim 12, wherein:

the photovoltaic module comprises a front laver, a back layer, and the encapsulated solar cell, wherein the encapsulated solar cell is positioned between the front layer and the back laver, and the process comprises the step of:

assembling the front layer, the first encapsulant layer, the solar cell, the second encapsulant layer and the back layer to form a photovoltaic assembly such that the solar cell is positioned between the first encapsulant layer and the second encapsulant layer; and the second encapsulant layer is in direct contact with the back layer;

heating the photovoltaic assembly at a temperature such that at least a portion of the first encapsulant layer and the second encapsulant layer melt to form a melted photovoltaic assembly comprising the solar cell;

pressing the melted photovoltaic assembly under heated conditions and forming the laminated photovoltaic module; and cooling the laminated photovoltaic module to ambient temperature and obtaining the photovoltaic module.

15. An encapsulant film for a photovoltaic module, wherein the encapsulant film comprises the film of claim 1.

16. A process for making a photovoltaic module, the method comprising positioning a solar cell between a first encapsulant film and a second encapsulant film, wherein the first encapsulant film, the second encapsulant film, or a combination thereof comprises the film of claim 1.

* * * * *